United States Patent
Wang et al.

(10) Patent No.: US 11,146,262 B1
(45) Date of Patent: Oct. 12, 2021

(54) LOW-NOISE REFERENCE VOLTAGE GENERATOR

(71) Applicant: Xilinx, Inc., San Jose, CA (US)

(72) Inventors: Yipeng Wang, Singapore (SG); Kee Hian Tan, Singapore (SG)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 16/930,785

(22) Filed: Jul. 16, 2020

(51) Int. Cl.
*H03K 3/00* (2006.01)
*H03K 17/16* (2006.01)
*H03K 19/003* (2006.01)
*H03K 17/14* (2006.01)

(52) U.S. Cl.
CPC ......... *H03K 17/162* (2013.01); *H03K 17/145* (2013.01); *H03K 19/00361* (2013.01)

(58) Field of Classification Search
CPC .............. H03K 17/162; H03K 17/145; H03K 19/00361
USPC ........................................................ 327/108
See application file for complete search history.

(56) References Cited

U.S. PATENT DOCUMENTS

| | | | | |
|---|---|---|---|---|
| 9,746,864 | B1* | 8/2017 | Narang | G05F 1/56 |
| 10,396,806 | B1* | 8/2019 | Chang | H03L 7/093 |
| 10,879,890 | B1* | 12/2020 | Tao | H03K 17/145 |
| 2017/0077883 | A1* | 3/2017 | Chang | H03F 3/45686 |
| 2019/0243402 | A1* | 8/2019 | Du | H03F 3/45269 |
| 2020/0012308 | A1* | 1/2020 | Chen | G05F 1/563 |
| 2020/0200602 | A1* | 6/2020 | Lee | H03F 3/45071 |

OTHER PUBLICATIONS

Lu et al., "A Fully-Integrated Low-Dropout Regulator with Full-Spectrum Power Supply Rejection," IEEE Transactions on Circuits and Systems—I: Regular Papers, vol. 62, No. 3, pp. 707-716, Mar. 2015.
Man et al., "Development of Single-Transistor-Control LDO Based on Flipped Voltage Follower for SoC," IEEE Transactions of Circuits and Systems—I: Regular Papers, vol. 55, No. 5, pp. 1392-1401, Jun. 2008.

* cited by examiner

*Primary Examiner* — Ryan Jager
(74) *Attorney, Agent, or Firm* — Paradice and Li LLP

(57) ABSTRACT

A reference voltage generator is disclosed. The reference voltage generator may include an operational transconductance amplifier (OTA), a bias generator, a first flipped voltage follower, a bias filter, a control signal filter, and a second flipped voltage follower. The OTA and the first flipped voltage follower may generate a control signal based on a reference voltage and a bias voltage from the bias generator. The bias filter may filter the bias voltage and the control signal filter may filter the control signal. The second flipped voltage follower may generate the output voltage based on the filtered bias voltage and the filtered control signal.

16 Claims, 3 Drawing Sheets

LOW-NOISE REFERENCE VOLTAGE GENERATOR

TECHNICAL FIELD

Aspects of the present disclosure relate generally to reference voltage generators, and more specifically to low-noise reference voltage generators.

BACKGROUND

Reference voltages are used by many different electronic circuits and devices. For example, an analog-to-digital converter (ADC) may use a reference voltage to perform analog to digital conversion of an input signal. In another example, a power supply may use a reference voltage to generate a particular output voltage. In still another example, a phase-locked loop (PLL) may use a reference voltage to generate a stable clock frequency. Stable and accurate reference voltages enable peak performance from circuits or devices that use the reference voltage.

Generating a reference voltage may require more than a simple reference voltage source. In some cases, the reference voltage may need voltage and/or current buffering before it can be used as a reference for an ADC or PLL. However, the buffering may introduce unwanted noise in the reference voltage which can negatively affect the performance of circuits and devices relying on the reference voltage.

Therefore, there is a need for a low-noise reference voltage signal generator.

SUMMARY

This Summary is provided to introduce in a simplified form a selection of concepts that are further described below in the Detailed Description. This Summary is not intended to identify key features or essential features of the claimed subject matter, nor is it intended to limit the scope of the claimed subject matter.

Aspects of the present disclosure are directed to reference voltage generator circuits configured to provide low-noise reference voltage signals. In one aspect, a reference voltage generator circuit is disclosed. The reference voltage generator may include a first flipped voltage follower configured to generate a control signal based at least in part on a reference voltage, a control signal filter configured to filter one or more frequencies of a control signal; and a second flipped voltage follower configured to generate a regulated output voltage based at least in part on the filtered control signal and the reference voltage.

In another example, a reference voltage generator may include a bias generator configured to generate a bias voltage, a first flipped voltage follower configured to generate a first output voltage based at least in part on a control signal and the bias voltage, a bias filter configured to filter the bias voltage, and a second flipped voltage follower configured to generate a second output voltage based at least in part on the control signal and the filtered bias voltage.

BRIEF DESCRIPTION OF THE DRAWINGS

The example embodiments are illustrated by way of example and are not intended to be limited by the figures of the accompanying drawings. Like numbers reference like elements throughout the drawings and specification.

DETAILED DESCRIPTION

Aspects of the present disclosure may reduce noise associated with a reference voltage. More particularly, a reference voltage generator is disclosed that utilizes a first flipped voltage follower, a bias filter, control signal filter, and a second flipped voltage follower. The first flipped voltage follower in combination with an operational transconductance amplifier may generate a control signal. The control signal filter may filter the control signal for the second flipped voltage follower. A bias filter may filter a bias voltage for the second flipped voltage follower. The second flipped voltage follower may use the filtered control signal and the filtered bias voltage to generate the reference voltage.

In the following description, numerous specific details are set forth such as examples of specific components, circuits, and processes to provide a thorough understanding of the present disclosure. The term "coupled" as used herein means coupled directly to or coupled through one or more intervening components or circuits. Also, in the following description and for purposes of explanation, specific nomenclature and/or details are set forth to provide a thorough understanding of the example embodiments. However, it will be apparent to one skilled in the art that these specific details may not be required to practice the example embodiments. In other instances, well-known circuits and devices are shown in block diagram form to avoid obscuring the present disclosure. Any of the signals provided over various buses described herein may be time-multiplexed with other signals and provided over one or more common buses. Additionally, the interconnection between circuit elements or software blocks may be shown as buses or as single signal lines. Each of the buses may alternatively be a single signal line, and each of the single signal lines may alternatively be buses, and a single line or bus might represent any one or more of a myriad of physical or logical mechanisms for communication between components. The example embodiments are not to be construed as limited to specific examples described herein but rather to include within their scope all embodiments defined by the appended claims.

Figure 1:
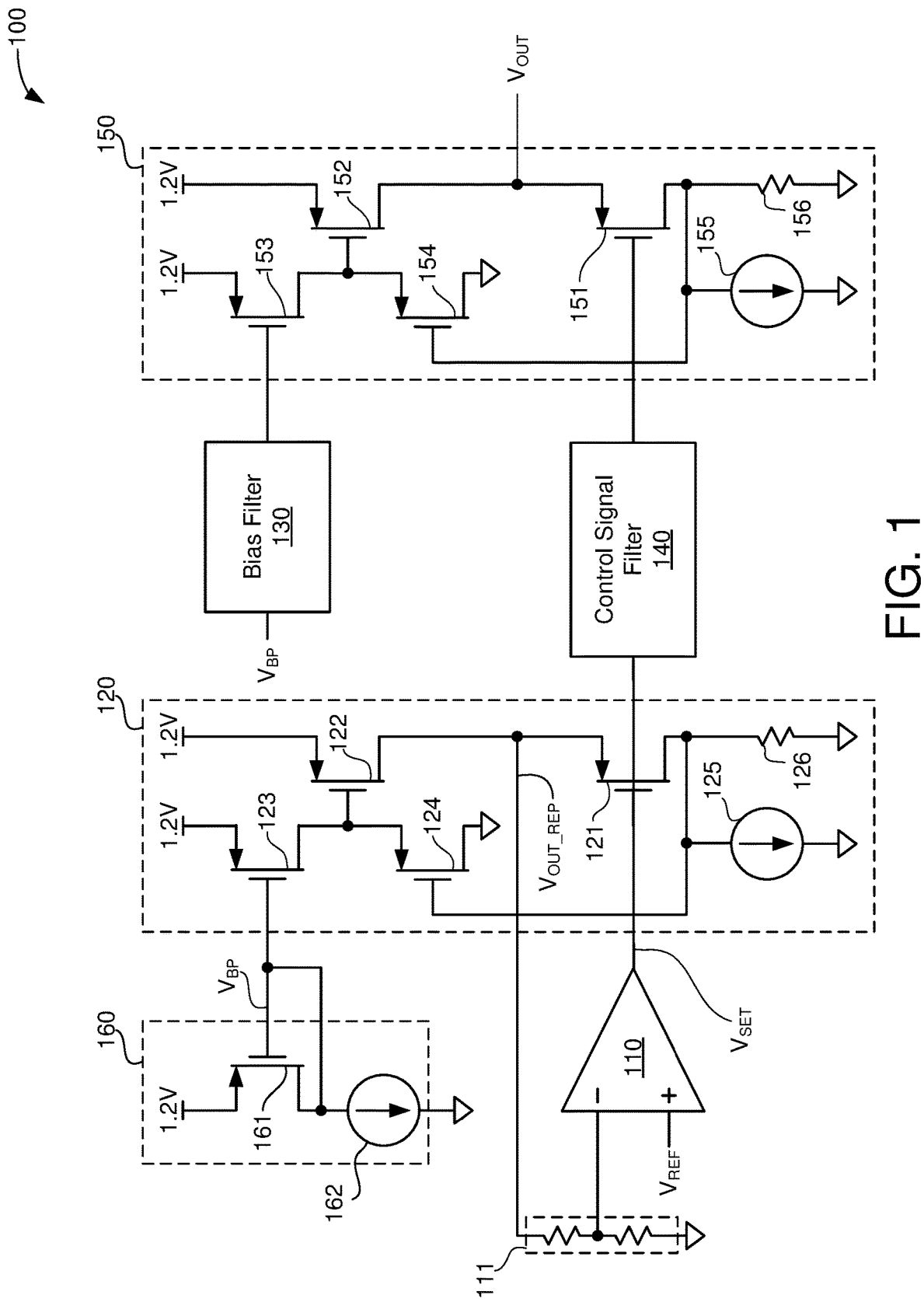
FIG. 1 is a simplified diagram of a reference voltage generator.

FIG. 1 is a simplified diagram of a reference voltage generator 100. The reference voltage generator 100 may generate a reference signal $V_{OUT}$ based on an input signal, such as a reference signal $V_{REF}$ and include an operational transconductance amplifier (OTA) 110, a voltage divider 111, a first flipped voltage follower (FVF) 120, a bias filter 130, a control signal filter 140, a second FVF 150, and a bias generator 160.

The OTA 110 and the first FVF 120 may collectively form a feedback loop to generate and regulate a signal $V_{OUT\_REP}$. The feedback loop may include a control signal $V_{SET}$ provided by the OTA 110 and $V_{OUT\_REP}$ provided by the first FVF 120. The second FVF 150 may receive a filtered $V_{SET}$ and may generate a $V_{OUT}$ reference signal based on the filtered $V_{SET}$. Since $V_{SET}$ is common to both the first FVF 120 and the second FVF 150, $V_{OUT}$ will track (e.g., match) $V_{OUT\_REP}$. $V_{OUT}$ may be used by other circuits or devices.

For example, $V_{OUT}$ may be used as a reference voltage for one or more analog-to-digital converters to convert an analog signal to a digital signal or for a phase-locked loop to generate a reference clock signal.

The OTA 110 may receive $V_{REF}$ at a first input. $V_{REF}$ may be provided by any stable reference source such as, for example, a bandgap voltage device. The OTA 110 may generate $V_{SET}$ based on $V_{REF}$ and $V_{OUT\_REP}$. $V_{SET}$ may be used to set a voltage of the first FVF 120 (e.g., $V_{OUT\_REP}$) and the second FVF 150 (e.g., $V_{OUT}$). The first FVF 120 may receive $V_{SET}$. The first FVF 120 may include transistors 121-124, current source 125, and resistor 126. In some implementations, transistor 121 and resistor 126 may determine a loop gain of the first FVF 120. As shown, the transistors 121-124 may be PMOS transistors, but in some implementations one or more of the transistors 121-124 may be NMOS transistors or any other feasible type of transistor.

The gate of transistor 121 may receive $V_{SET}$. Transistor 121 may operate as a source follower transistor and provide unity gain for $V_{SET}$. For example, the source voltage of transistor 121 ($V_{OUT\_REP}$) may follow (track) the gate voltage of transistor 121 ($V_{SET}$). $V_{OUT\_REP}$ may be offset by a fixed voltage (e.g., a threshold voltage (VTH) of transistor 121) from $V_{SET}$. The current source 125 may provide a bias current that enables transistor 121 to operate as a source follower.

The drain voltage of transistor 121 may track the source voltage of transistor 121. For example, the drain voltage of transistor 121 may be offset from the source voltage of transistor 121 by a saturation voltage ($V_{DS\_SAT}$). Thus, increases or decreases of $V_{SET}$ may cause the drain voltage of transistor 121 to similarly increase and decrease by changing current through the resistor 126 and thereby changing the source voltage of transistor 121.

In some implementations, transistor 123 may provide a bias current for transistor 124. The bias current may cause the source voltage of transistor 124 to be offset from the gate voltage of transistor 124 by VTH. The drain of transistor 121 may be coupled to the gate of transistor 124. Thus, the source voltage of transistor 124 may be controlled by the drain voltage of transistor 121.

The source of transistor 124 may be coupled to the gate of transistor 122. Transistor 122 may control current delivered through transistor 121. Therefore, the drain voltage of transistor 121 may control current through transistor 122 and regulate $V_{OUT\_REP}$. $V_{OUT\_REP}$ may be coupled to a second input of the OTA 110 through the voltage divider 111. In some implementations, the voltage divider 111 may be replaced with other circuits or devices that may scale and couple $V_{OUT\_REP}$ to the second input of the OTA 110.

The bias generator 160 may include transistor 161 and current source 162. The bias generator 160 may provide a bias voltage $V_{BP}$ to the first FVF 120. More particularly, $V_{BP}$ may be provided to the gate of transistor 123, which in turn provides bias current for transistor 124. In some implementations, transistor 123 and transistor 161 may form a current mirror. Thus, a drain current of transistor 123 (and therefore bias current for transistor 124) may be provided at least in part by the current source 162.

The second FVF 150 may include transistors 151-154, a current source 155, and resistor 156. In some implementations, transistor 151 and resistor 156 may determine a loop gain of the second FVF 150. The control signal filter 140 may provide a filtered $V_{SET}$ signal to the gate of transistor 151. The bias filter 130 may provide a filtered $V_{BP}$ to the gate of transistor 153. The components (transistors, current source, etc.) of the second FVF 150 may be configured similarly and perform similarly to the equivalent components of the first FVF 120. For example, transistor 151 may operate as a source follower and generate $V_{OUT}$ based on the gate voltage of transistor 151 (e.g., the filtered $V_{SET}$ signal). Further, the transistors 152-154 may operate similar to transistors 122-124, respectively. Thus, the gate voltage of transistor 152 may be controlled by the drain voltage of transistor 151 through transistor 154. The gate of transistor 153 may receive the filtered $V_{BP}$ to enable transistor 153 to control transistor 152 and regulate $V_{OUT}$.

In some implementations, $V_{SET}$ may include device and/or power supply noise that may originate from the OTA 110 and/or the first FVF 120. This noise may be passed by the second FVF 150 to $V_{OUT}$ through transistor 151. The control signal filter 140 may be configured to reduce or eliminate device and/or power supply noise in $V_{SET}$ and thereby reduce noise in $V_{OUT}$. The control signal filter 140 is described in more detail with respect to FIG. 2.

In some implementations, noise in the bias signal $V_{BP}$ may cause noise in the bias current provided to transistor 154. A noisy $V_{BP}$ may affect the gate voltage of transistor 152 and impair regulation of the $V_{OUT}$. As described above, transistors 152-154 may regulate $V_{OUT}$ based at least in part on $V_{BP}$. The bias filter 130 may reduce or eliminate noise in the bias signal $V_{BP}$ and thereby reduce noise in $V_{OUT}$. The bias filter 130 is described in more detail with respect to FIG. 3.

Figure 2:
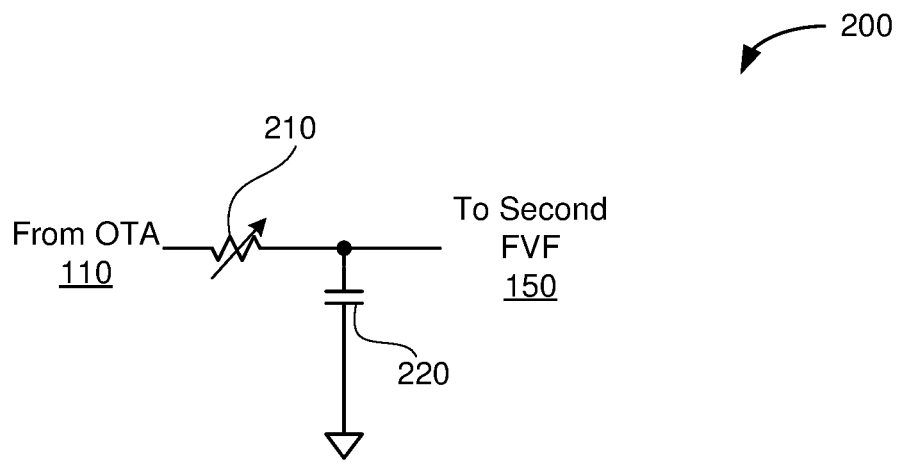
FIG. 2 is a simplified schematic diagram of a control signal filter.

FIG. 2 is a simplified schematic diagram of a control signal filter 200. The control signal filter 200 may be an implementation the control signal filter 140 of FIG. 1 and include a resistor 210 and a capacitor 220.

The control signal filter 200 may reduce or eliminate noise in $V_{SET}$. In some implementations, the resistor 210 and the capacitor 220 may form a low-pass filter. Noise characteristics of $V_{SET}$ may be determined by measuring one or more signals associated with the reference voltage generator 100 or through simulation. Values of the resistor 210 and the capacitor 220 may be selected to provide a frequency response of the control signal filter 200 based on the noise characteristics of $V_{SET}$. The resistance of the resistor 210 may be adjusted to compensate for process, voltage, or temperature variations. In some implementations, the resistor 210 may be a variable resistor that may be trimmed during manufacturing or may be adjusted during operation. In some other implementations, the resistor 210 may be a fixed resistor or implemented through active devices such as one or more transistors.

Although shown as a resistor-capacitor network, in some implementations, the control signal filter 200 may be realized using any other feasible low-pass filter design. For example, more or fewer components, active devices, and/or a mixture of active and passive devices may be used to implement the control signal filter 200.

Figure 3:
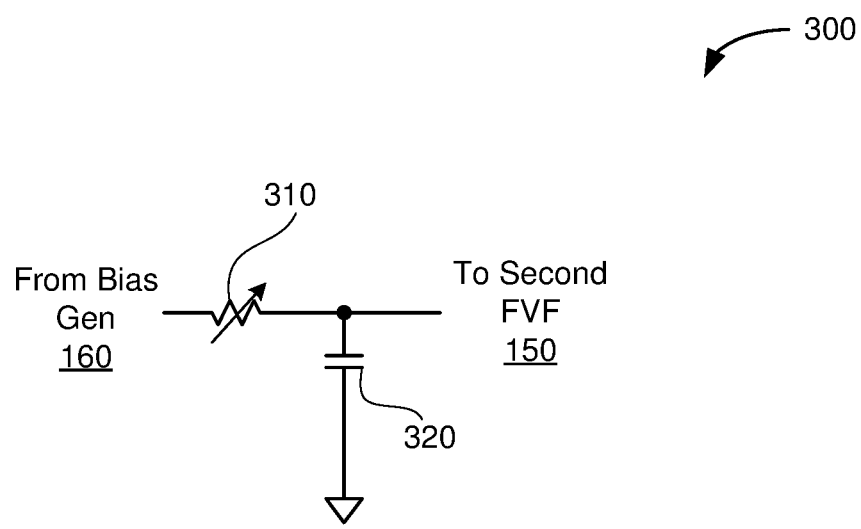
FIG. 3 is a simplified schematic diagram of a bias filter.

FIG. 3 is a simplified schematic diagram of a bias filter 300. The bias filter 300 may be an implementation of the bias filter 130 of FIG. 1 and may include a resistor 310 and a capacitor 320.

The bias filter 300 may reduce and/or eliminate noise in $V_{BP}$. In some implementations, the resistor 310 and the capacitor 320 may form a low-pass filter. In addition, the bias filter 300 may provide a supply dependent voltage ($V_{BP}$) for the transistor 153. Due to the supply dependent voltage $V_{BP}$, transistor 153 may generate a supply noise modulated bias current for the transistor 154. The supply noise modulated bias current may actively compensate and/or reject supply noise from the transistor 152 by maintaining a constant (e.g., noise independent) gate-to-source voltage for transistor 152. Noise characteristics of $V_{BP}$ may be determined by measuring one or more signals associated with the reference voltage generator 100 or through simulation. Values of the resistor 310 and the capacitor 320 may be selected to provide a frequency response of the bias filter 300 based on the noise characteristics of $V_{BP}$. In some implementations, the resistor 310 may be a variable resistor that may be trimmed during manufacturing or may be adjusted during operation. In other implementations, the resistor 310 may be a fixed resistor or implemented using active devices such as one or more transistors. Although shown as a resistor-capacitor network, in some implementations, the bias filter 300 may be realized using any other feasible low-pass filter design. For example, more or fewer components, active devices, and/or a mixture of active and passive devices may be used to implement the bias signal filter 300.

Figure 4:
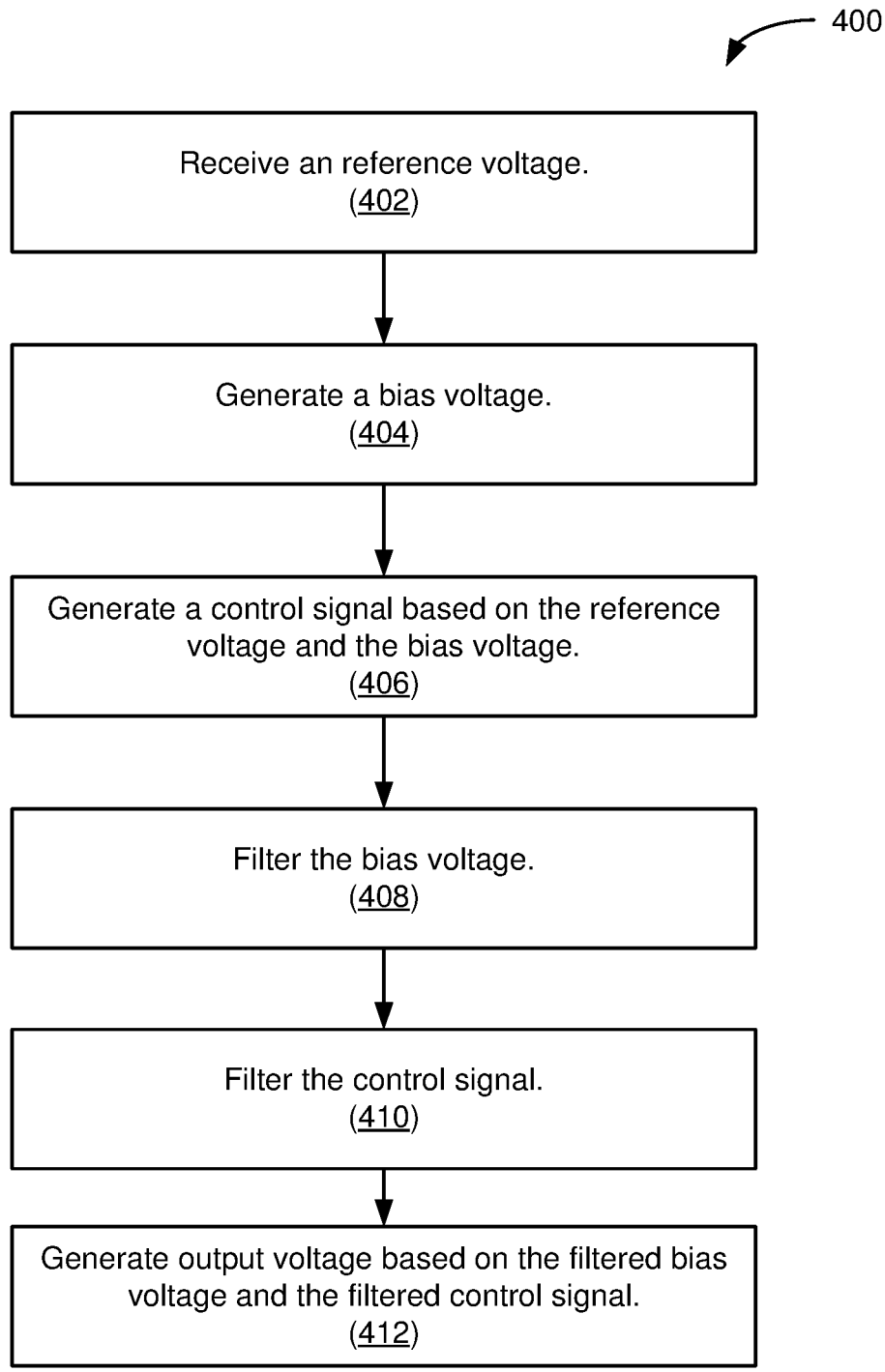
FIG. 4 is an illustrative flowchart of an operation for operating a reference voltage generator, according to some implementations.

FIG. 4 is an illustrative flowchart of an operation 400 for operating a reference voltage generator, according to some implementations. The operation 400 is described with respect to the reference voltage generator 100 of FIG. 1. However, in other implementations, the operation 400 may be performed by any suitable reference voltage generator. Some implementations may perform the operations described herein with additional operations, fewer operations, operations in a different order, operations in parallel, and/or some operations differently.

The operation begins as the reference voltage generator 100 receives a reference voltage (402). For example, the OTA 110 of the reference voltage generator 100 may receive $V_{REF}$ from a suitable source such as a bandgap device. The reference voltage generator 100 may generate a bias voltage (404). For example, the bias generator 160 of the reference voltage generator 100 may generate the bias voltage $V_{BP}$.

The reference generator 100 generates a control signal based on $V_{REF}$ and the bias voltage (406). For example, the first FVF 120 of the reference generator 100 may receive the bias voltage $V_{BP}$. The OTA 110 may generate $V_{SET}$ based on a feedback loop based on $V_{OUT\_REP}$ from the first FVF 120 and $V_{REF}$.

The reference generator 100 filters the bias voltage (408). For example, the bias filter 130 may filter the bias voltage $V_{BP}$ provided by the bias generator 160. In some implementations, the bias filter 130 may include one or more components or devices including, for example, a resistor-capacitor network to filter the bias voltage. In some implementations, the bias filter 130 may include a low-pass filter. The reference generator 100 filters the control signal (410). For example, the control signal filter 140 may filter $V_{SET}$ from the OTA 110. In some implementations, the control signal filter 140 may include one or more components or devices including, but not limited to, a resistor-capacitor network to filter $V_{SET}$. The control signal filter 140 may include a low-pass filter.

The reference generator 100 may generate $V_{OUT}$ based on the filtered bias voltage and the filtered control signal (412). For example, the reference generator 100 may include a second FVF 150 that generates $V_{OUT}$ based on the filtered bias voltage from the bias filter 130 and the filtered control signal from the control signal filter 140.

Those of skill in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Further, those of skill in the art will appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the disclosure.

The methods, sequences or algorithms described in connection with the aspects disclosed herein may be embodied directly in hardware, in a software module executed by a processor, or in a combination of the two. A software module may reside in RAM latch, flash latch, ROM latch, EPROM latch, EEPROM latch, registers, hard disk, a removable disk, a CD-ROM, or any other form of storage medium known in the art. An example storage medium is coupled to the processor such that the processor can read information from, and write information to, the storage medium. In the alternative, the storage medium may be integral to the processor.

In the foregoing specification, the example embodiments have been described with reference to specific example embodiments thereof. It will, however, be evident that various modifications and changes may be made thereto without departing from the broader scope of the disclosure as set forth in the appended claims. The specification and drawings are, accordingly, to be regarded in an illustrative sense rather than a restrictive sense.

What is claimed is:

1. An apparatus, comprising:
    a first flipped voltage follower (FVF) configured to generate a control signal based at least in part on a reference voltage;
    a control signal filter configured to filter one or more frequencies of the control signal; and
    a second FVF configured to generate a regulated output voltage based at least in part on the filtered control signal the reference voltage, and a bias voltage; and
    a bias filter configured to filter one or more frequencies of the bias voltage and generate a filtered bias voltage for the second FVF, wherein the regulated output voltage is based at least in part on the filtered bias voltage.

2. The apparatus of claim 1, wherein the control signal filter includes a low-pass filter.

3. The apparatus of claim 1, further comprising:
    an operational transconductance amplifier configured to generate the control signal based on the reference voltage and a feedback signal from the first FVF.

4. The apparatus of claim 1, wherein the control signal filter includes a first resistor-capacitor network configured to filter one or more frequencies the control signal.

5. The apparatus of claim 4, wherein the first resistor-capacitor network includes a variable resistor.

6. The apparatus of claim 4, wherein the control signal filter is configured to filter the control signal based at least in part on noise characteristics of the control signal.

7. The apparatus of claim 1, wherein the bias filter includes a second resistor-capacitor network configured to filter the bias voltage.

8. The apparatus of claim 1, wherein the bias filter is configured to filter the bias voltage based at least in part on noise characteristics of the bias voltage.

9. An apparatus, comprising:
- a bias generator configured to generate a bias voltage;
- a first flipped voltage follower (FVF) configured to generate a first output voltage based at least in part on the bias voltage;
- a bias filter configured to filter the bias voltage; and
- a second FVF configured to generate a second output voltage based at least in part on the filtered bias voltage; and
- an operational transconductance amplifier configured to generate a control signal based at least in part on a reference voltage and the first output voltage from the first FVF.

10. The apparatus of claim 9, wherein the bias filter is configured to filter the bias voltage based at least in part on process variations of components included in the second FVF.

11. The apparatus of claim 9, wherein the bias filter is configured to filter the bias voltage based at least in part a resistor-capacitor network.

12. The apparatus of claim 11, wherein a value of a resistor of the resistor-capacitor network is set during manufacturing.

13. The apparatus of claim 9, further comprising a control signal filter configured to filter one or more frequencies of the control signal.

14. The apparatus of claim 13, wherein the control signal filter is configured to filter the control signal based at least in part on noise characteristics of the control signal.

15. A method of generating a regulated output voltage comprising:
- generating, by a first flipped voltage follower (FVF), a control signal based at least in part on a reference voltage and a bias voltage;
- filtering the control signal;
- filtering, by a second low-pass filter, the bias voltage; and
- generating a regulated output voltage based at least in part on the filtered control signal and the filtered bias voltage.

16. The method of claim 15, wherein the filtering the control signal includes filtering the control signal with a first low-pass filter.

* * * * *